(12) United States Patent
Koyama et al.

(10) Patent No.: US 10,103,231 B2
(45) Date of Patent: Oct. 16, 2018

(54) SEMICONDUCTOR DEVICE

(71) Applicant: Kabushiki Kaisha Toshiba, Minato-ku (JP)

(72) Inventors: Masahiro Koyama, Kawasaki (JP); Hisashi Saito, Yokohama (JP); Tatsuo Shimizu, Shinagawa (JP); Shinya Nunoue, Ichikawa (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 15/439,278

(22) Filed: Feb. 22, 2017

(65) Prior Publication Data

US 2018/0076291 A1    Mar. 15, 2018

(30) Foreign Application Priority Data

Sep. 15, 2016    (JP) .................... 2016-180129

(51) Int. Cl.
*H01L 29/20* (2006.01)
*H01L 27/092* (2006.01)
(Continued)

(52) U.S. Cl.
CPC ........ *H01L 29/2003* (2013.01); *H01L 27/092* (2013.01); *H01L 29/517* (2013.01); *H01L 29/518* (2013.01); *H01L 29/78* (2013.01)

(58) Field of Classification Search
CPC ........ H01L 29/66431; H01L 29/66462; H01L 29/778; H01L 29/7781; H01L 29/7782; H01L 29/7786; H01L 2924/13064
(Continued)

(56) References Cited

U.S. PATENT DOCUMENTS 6,949,769 B2    9/2005    Hu et al.
8,022,488 B2    9/2011    Cheng et al.
(Continued)

FOREIGN PATENT DOCUMENTS

JP    2012-124215    6/2012
JP    2012-124327 *  6/2012    ............. H01L 29/80
(Continued)

OTHER PUBLICATIONS

P.H.Holloway et al. "Interfacial reactions in the formation of ohmic contacts to wide bandgap semiconductors," Applied Surface Science 117/118, 1997, pp. 6.
(Continued)

*Primary Examiner* — Moin Rahman
(74) *Attorney, Agent, or Firm* — Oblon, McClelland, Maier & Neustadt, L.L.P.

(57) ABSTRACT

According to one embodiment, a semiconductor device includes a first element portion. The first element portion includes first and second semiconductor layers, first, second and third electrodes, and a first insulating layer. The first semiconductor layer includes $Al_{x1}Ga_{1-x1}N$ ($0 \leq x1 < 1$). The first electrode is separated from the first semiconductor layer. The first electrode includes a polycrystal of a nitride of one of Al or B. The second semiconductor layer includes $Al_{x2}Ga_{1-x2}N$ ($x1 < x2 < 1$). The second semiconductor layer includes first to third regions. The first region is positioned between the second and third regions. The first region is provided between the first semiconductor layer and the first electrode. The first insulating layer is provided between the first region and the first electrode. The second electrode is electrically connected to the second region. The third electrode is electrically connected to the third region.

18 Claims, 4 Drawing Sheets

(51) Int. Cl.
*H01L 29/51* (2006.01)
*H01L 29/78* (2006.01)

(58) Field of Classification Search
USPC .......... 257/20, 194, 135–136, 213–413, 900, 257/902–903
See application file for complete search history.

(56) References Cited

U.S. PATENT DOCUMENTS

| | | | |
|---|---|---|---|
| 8,643,025 | B2 | 2/2014 | Nakayama |
| 9,111,786 | B1 | 8/2015 | Kub et al. |
| 9,196,614 | B2 | 11/2015 | Kub et al. |
| 2009/0189188 | A1* | 7/2009 | Matsushita ......... H01L 29/1029 257/192 |
| 2010/0200935 | A1* | 8/2010 | Hokazono ......... H01L 21/26513 257/408 |
| 2012/0187413 | A1* | 7/2012 | Saito ................. H01L 29/66462 257/76 |
| 2013/0248873 | A1* | 9/2013 | Kuraguchi ............ H01L 29/812 257/76 |
| 2014/0284655 | A1* | 9/2014 | Ikeda .................. H01L 27/0266 257/139 |
| 2015/0162424 | A1* | 6/2015 | Briere .................. H01L 29/778 257/194 |
| 2015/0263154 | A1* | 9/2015 | Fujimoto ............ H01L 29/7786 257/76 |
| 2015/0318387 | A1* | 11/2015 | Chiu ..................... H01L 23/291 257/76 |
| 2015/0325662 | A1* | 11/2015 | Wang ................ H01L 21/28088 438/589 |
| 2016/0225857 | A1 | 8/2016 | Saito et al. |
| 2016/0225886 | A1 | 8/2016 | Saito et al. |
| 2017/0077260 | A1* | 3/2017 | Shimizu ................ H01L 29/518 |
| 2017/0077277 | A1 | 3/2017 | Saito et al. |
| 2018/0061974 | A1 | 3/2018 | Saito et al. |

FOREIGN PATENT DOCUMENTS

| | | |
|---|---|---|
| JP | 2013-4735 | 1/2013 |
| JP | 2013-506291 | 2/2013 |
| JP | 2016-143842 | 8/2016 |
| JP | 2016-143843 | 8/2016 |
| JP | 2017-59599 A | 3/2017 |
| JP | 2018-37435 A | 3/2018 |

OTHER PUBLICATIONS

Thorsten U. Kampen et al. "Barrier heights of GaN Schottky contacts," Applied Surface Science 117/118, 1997, pp. 3.

Man Hoi Wong et al., "Anomalous Output Conductance in N-Polar GaN High Electron Mobility Transistors," IEEE Transactions on Electron Devices, vol. 59, No. 11, Nov. 2012, pp. 8.

John L. Lyons et al. "Identification of Microscopic Hole-Trapping Mechanisms in Nitride Semiconductors," IEEE Electron Device Letters, vol. 37, No. 2, Feb. 2016, pp. 3.

* cited by examiner

SEMICONDUCTOR DEVICE

CROSS-REFERENCE TO RELATED APPLICATIONS

This application is based upon and claims the benefit of priority from Japanese Patent Application No. 2016-180129, filed on Sep. 15, 2016; the entire contents of which are incorporated herein by reference.

FIELD

Embodiments described herein relate generally to a semiconductor device.

BACKGROUND

There is a semiconductor device such as a transistor or the like that uses a nitride semiconductor. It is desirable for the semiconductor device to be easy to use.

DETAILED DESCRIPTION

Figure 1:
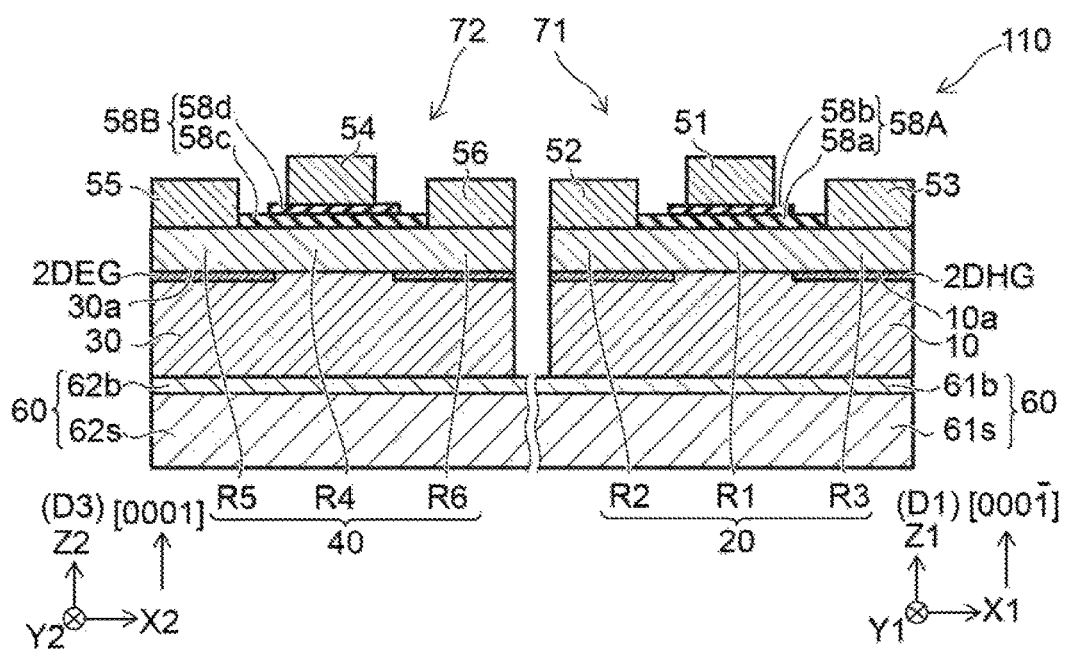
FIG. 1 is a schematic cross-sectional view illustrating a semiconductor device according to a first embodiment.

According to one embodiment, a semiconductor device includes a first element portion. The first element portion includes a first semiconductor layer, a first electrode, a second semiconductor layer, a first insulating layer, a second electrode, and a third electrode. The first semiconductor layer includes $Al_{x1}Ga_{1-x1}N$ ($0 \leq x1 < 1$). The first electrode is separated from the first semiconductor layer in a first direction. The first electrode is positioned in the [000-1] direction of the first semiconductor layer and includes a polycrystal of a nitride of one of Al or B. The second semiconductor layer includes $Al_{x2}Ga_{1-x2}N$ ($x1 < x2 < 1$). The second semiconductor layer includes first to third regions. The first region is positioned between the second region and the third region in a second direction crossing the first direction. The first region is provided between the first semiconductor layer and the first electrode. The first insulating layer is provided between the first region and the first electrode. The second electrode is electrically connected to the second region. The third electrode is electrically connected to the third region.

According to another embodiment, a semiconductor device includes a first semiconductor layer, a first electrode, a second semiconductor layer, a first insulating layer, a second electrode, and a third electrode. The first semiconductor layer includes $Al_{x1}Ga_{1-x1}N$ ($0 \leq x1 < 1$). The first electrode is separated from the first semiconductor layer in a first direction. The first electrode is positioned in the [0001] direction of the first semiconductor layer and includes a polycrystal of a nitride of one of Al or B. The second semiconductor layer includes $Al_{x2}Ga_{1-x2}N$ ($x1 < x2 < 1$). The second semiconductor layer includes first to third regions. The first region is positioned between the second region and the third region in a second direction crossing the first direction. The first region is provided between the first semiconductor layer and the first electrode. The first insulating layer is provided between the first region and the first electrode. The second electrode is electrically connected to the second region. The third electrode is electrically connected to the third region.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. There are also cases where the dimensions and/or the proportions are illustrated differently between the drawings, even in the case where the same portion is illustrated.

In this specification and each drawing, components similar to ones described in reference to an antecedent drawing are marked with the same reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first element portion 71. A second element portion 72 also is provided in the example. As described below, in the embodiment, the first element portion 71 may be provided; and the second element portion 72 may not be provided. First, the first element portion 71 will be described.

The first element portion 71 includes a first semiconductor layer 10, a second semiconductor layer 20, first to third electrodes 51 to 53, and a first insulating layer 58A.

The first semiconductor layer 10 includes $Al_{x1}Ga_{1-x1}N$ ($0 \leq x1 < 1$). The composition ratio x1 of Al of the first semiconductor layer 10 is, for example, 0.01 or less. The composition ratio x1 may be substantially 0. The first semiconductor layer 10 may be, for example, a GaN layer.

The first electrode 51 is separated from the first semiconductor layer 10 in a first direction D1. The first direction D1 is a direction from the first semiconductor layer 10 toward the first electrode 51.

The first direction D1 is taken as a Z1-direction. One direction perpendicular to the Z1-direction is taken as an X1-direction. A direction perpendicular to the Z1-direction and the X1-direction is taken as a Y1-direction. For example, the first semiconductor layer 10 spreads parallel to the X1-Y1 plane.

The first electrode 51 is positioned in the [000-1] direction of the first semiconductor layer 10. For example, the first semiconductor layer 10 has a surface 10a (in FIG. 1, the upper surface) on the first electrode 51 side. The surface 10a is, for example, the N-plane of a GaN layer. The [000-1] direction may be tilted with respect to the first direction D1.

The first electrode 51 includes a polycrystal of a nitride of one of Al or B. For example, at least a portion of the first electrode 51 includes at least one of a polycrystal of AlN or a polycrystal of BN. Multiple crystal grain images of the crystal can be observed by, for example, transmission electron microscope (TEM) observation or X-ray (X-ray diffraction (XRD)) analysis. For example, the crystal orientation can be observed using the observation or the analysis recited above.

The second semiconductor layer 20 includes first to third regions R1 to R3. The first region R1 is positioned between the second region R2 and the third region R3 in a second direction. The second direction crosses the first direction D1. In the example, the second direction is the X1-direction. The first region R1 is provided between the first semiconductor layer 10 and the first electrode 51.

The second semiconductor layer includes $Al_{x2}Ga_{1-x2}N$ (x1<x2<1). The composition ratio of Al of the second semiconductor layer 20 is, for example, not less than 0.1 and not more than 0.4. The second semiconductor layer 20 is, for example, an AlGaN layer. For example, the second semiconductor layer 20 physically contacts the first semiconductor layer 10.

The first insulating layer 58A is provided between the first electrode 51 and the first region R1 of the second semiconductor layer 20.

A second electrode 52 is electrically connected to the second region R2. The third electrode 53 is electrically connected to the third region R3. For example, the second electrode 52 has an ohmic contact with the second region R2. For example, the third electrode 53 has an ohmic contact with the third region R3.

For example, the second region R2 is provided between the second electrode 52 and the first semiconductor layer 10. For example, the third region R3 is provided between the third electrode 53 and the first semiconductor layer 10. A portion of the second semiconductor layer 20 positioned between the first electrode 51 and the first semiconductor layer 10 is at least a portion of the first region R1. A portion of the second semiconductor layer 20 positioned between the second electrode 52 and the first semiconductor layer 10 is at least a portion of the second region R2. A portion of the second semiconductor layer 20 positioned between the third electrode 53 and the first semiconductor layer 10 is at least a portion of the third region R3. The first to third regions R1 to R3 are continuous with each other; and the boundaries are indistinct.

The first element portion 71 is, for example, a transistor. For example, the first electrode 51 functions as a gate electrode. For example, the second electrode 52 functions as a source electrode. For example, the third electrode 53 functions as a drain electrode. The first insulating layer 58A functions as a gate insulating film.

For example, the first insulating layer 58A includes at least one selected from the group consisting of silicon oxide (e.g., $SiO_2$), magnesium oxide (MgO), aluminum oxide (e.g., $Al_2O_3$), silicon nitride (e.g., SiN), aluminum nitride (AlN), and boron nitride (BN).

In the example, the first insulating layer 58A includes multiple films (stacked films). The first insulating layer 58A includes a first insulating film 58a and a second insulating film 58b. The second insulating film 58b is provided between the first insulating film 58a and the first electrode 51. For example, the first insulating film 58a includes a nitride. The second insulating film 58b includes an oxide. For example, the first insulating film 58a Includes at least one selected from the group consisting of silicon nitride, aluminum nitride, and boron nitride. The second insulating film 58b includes at least one selected from the group consisting of silicon oxide, aluminum oxide, zirconium oxide, and magnesium oxide. For example, the first insulating film 58a functions as a protective film of the second semiconductor layer 20. For example, the second insulating film 58b functions as a gate insulating film.

The first electrode 51 includes, for example, at least one first element selected from the group consisting of Si, Ge, C, and O. The first element is, for example, an impurity. The concentration of the first element of the first electrode 51 is, for example, not less than $10^{15}$ $cm^{-3}$ and not more than $10^{22}$ $cm^{-3}$. The first element functions as an n-type impurity in the first electrode 51. For example, the threshold of the first element portion 71 can be set to be high.

The first element portion 71 is, for example, a p-MISFET (p-type Metal Insulator Semiconductor Field Effect Transistor) having a normally-off operation. Thereby, the operation is safe. The ease of use can be improved.

Examples of the characteristics of the first element portion 71 are described below. The second element portion 72 will now be described.

The second element portion 72 includes a third semiconductor layer 30, a fourth semiconductor layer 40, fourth to sixth electrodes 54 to 56, and a second insulating layer 58B.

The third semiconductor layer 30 includes $Al_{x3}Ga_{1-x3}N$ (0≤x3<1). The Al composition ratio x3 of the third semiconductor layer 30 is, for example, 0.01 or less. x3 may be substantially 0. The third semiconductor layer 30 is, for example, a GaN layer.

The fourth electrode 54 is separated from the third semiconductor layer 30 in a third direction D3. The third direction D3 is a direction from the third semiconductor layer 30 toward the fourth electrode 54.

The third direction D3 is taken as a Z2-direction. One direction perpendicular to the Z2-direction is taken as an X2-direction. A direction perpendicular to the Z2-direction and the X2-direction is taken as a Y2-direction. For example, the third semiconductor layer 30 spreads parallel to the X2-Y2 plane.

The fourth electrode 54 is positioned in the [0001] direction of the third semiconductor layer 30. For example, the third semiconductor layer 30 has a surface 30a (In FIG. 1, the upper surface) on the fourth electrode 54 side. The surface 30a is, for example, the Ga-plane of a GaN layer. The [0001] direction may be tilted with respect to the third direction D3.

The third direction D3 may be substantially parallel to the first direction D1. The third direction D3 may cross the first direction D1. The third direction D3 may be tilted with respect to the first direction D1. The third direction D3 may have a component that is the reverse of the first direction D1.

The fourth electrode 54 includes a polycrystal of a nitride of one of Al or B.

The fourth semiconductor layer 40 includes fourth to sixth regions R4 to R6. The fourth region R4 is positioned between the fifth region R5 and the sixth region R6 in a fourth direction. The fourth direction crosses the third direction D3. In the example, the fourth direction is the X2-direction. The fourth region R4 is provided between the third semiconductor layer 30 and the fourth electrode 54.

The fourth semiconductor layer 40 includes $Al_{x4}Ga_{1-x4}N$ (x3<x4<1). The Al composition ratio x4 of the fourth semiconductor layer 40 is, for example, not less than 0.1 and not more than 0.4. The fourth semiconductor layer 40 is, for example, an AlGaN layer.

The second insulating layer 58B is provided between the fourth region R4 and the fourth electrode 54.

The fifth electrode 55 is electrically connected to the fifth region R5. The sixth electrode 56 is electrically connected to the sixth region R6. For example, the fifth electrode 55 has an ohmic contact with the fifth region R5. For example, the sixth electrode 56 has an ohmic contact with the sixth region R6.

For example, the fifth region R5 is provided between the fifth electrode 55 and the third semiconductor layer 30. For example, the sixth region R6 is provided between the sixth electrode 56 and the third semiconductor layer 30. A portion of the fourth semiconductor layer 40 positioned between the fourth electrode 54 and the third semiconductor layer 30 is at least a portion of the fourth region R4. A portion of the fourth semiconductor layer 40 positioned between the fifth electrode 55 and the third semiconductor layer 30 is at least a portion of the fifth region R5. A portion of the fourth semiconductor layer 40 positioned between the sixth electrode 56 and the third semiconductor layer 30 is at least a portion of the sixth region R6. The fourth to sixth regions R4 to R6 are continuous with each other; and the boundaries are indistinct.

The second element portion 72 is, for example, a transistor. For example, the fourth electrode 54 functions as a gate electrode. For example, the fifth electrode 55 functions as a source electrode. For example, the sixth electrode 56 functions as a drain electrode. The second insulating layer 58B functions as a gate insulating film.

For example, the second insulating layer 58B also includes at least one selected from the group consisting of silicon oxide ($SiO_2$), magnesium oxide (MgO), aluminum oxide ($Al_2O_3$), silicon nitride (SiN), aluminum nitride (AlN), and boron nitride (BN).

In the example as well, the second insulating layer 58B includes multiple films (stacked films). The second insulating layer 58B includes a third insulating film 58c and a fourth insulating film 58d. The fourth insulating film 58d is provided between the third insulating film 58c and the fourth electrode 54. For example, the third insulating film 58c includes a nitride. The fourth insulating film 58d includes an oxide. For example, the third insulating film 58c includes at least one selected from the group consisting of silicon nitride, aluminum nitride, and boron nitride. The fourth insulating film 58d includes at least one selected from the group consisting of silicon oxide, aluminum oxide, zirconium oxide, and magnesium oxide. For example, the third insulating film 58c functions as a protective film of the fourth semiconductor layer 40. For example, the fourth insulating film 58d functions as a gate insulating film.

The fourth electrode 54 includes, for example, at least one second element selected from the group consisting of Mg, Be, Zn, and C. The second element is, for example, an impurity. The concentration of the second element of the fourth electrode 54 is, for example, not less than $10^{15}$ cm$^{-3}$ and not more than $10^{22}$ cm$^{-3}$. The second element functions as a p-type impurity of the fourth electrode 54. For example, the threshold of the second element portion 72 can be set to be high.

The second element portion 72 is, for example, an n-MISFET (n-type Metal Insulator Semiconductor Field Effect Transistor) having a normally-off operation. Thereby, the operation is safe. The ease of use can be improved.

A base body 60 is provided in the example. The base body 60 may include, for example, a substrate 61s and a substrate 62s. At least one of the substrate 61s or the substrate 62s includes, for example, a GaN substrate, a sapphire substrate, a SIC substrate, a Si substrate, etc. For example, in the case where the substrate 61s includes silicon, a first buffer layer 61b may be provided between the substrate 61s and the first semiconductor layer 10. For example, in the case where the substrate 62s includes silicon, a second buffer layer 62b may be provided between the substrate 62s and the third semiconductor layer 30. For example, these buffer layers may include multiple stacked nitride semiconductor layers. For example, the strain is adjusted; and cracks are suppressed. For example, the dislocation density can be low.

As shown in FIG. 1, for example, in the first element portion 71, for example, the surface 10a of the first semiconductor layer 10 contacts the second semiconductor layer 20. A two-dimensional hole gas 2DHG (Two Dimensional Hole Gas) is generated at the vicinity of the surface 10a. Thus, the two-dimensional hole gas 2DHG is generated in a portion of the heterojunction interface. For example, the two-dimensional hole gas 2DHG is used as at least a portion of the channel. For example, when a voltage is not applied to the first electrode 51, the two-dimensional hole gas 2DHG is not generated under the first electrode 51. The first element portion 71 has a normally-off operation.

For example, in the second element portion 72, for example, the surface 30a of the third semiconductor layer 30 contacts the fourth semiconductor layer 40. A two-dimensional electron gas 2DEG is generated at the vicinity of the surface 30a. Thus, the two-dimensional electron gas 2DEG (Two Dimensional Electron Gas) is generated in a portion of the heterojunction interface. For example, the two-dimensional electron gas 2DEG is used as at least a portion of the channel. For example, when a voltage is not applied to the fourth electrode 54, the two-dimensional electron gas 2DEG is not generated under the fourth electrode 54. The second element portion 72 has a normally-off operation.

In the first element portion 71, the first electrode 51 includes a wide-gap material that is polycrystalline. Thereby, the normally-off operation is obtained.

In the second element portion 72, the fourth electrode 54 includes a wide-gap material that is polycrystalline. Thereby, the normally-off operation is obtained.

On the other hand, there is a first reference example of a recessed p-MOSFET. In the first reference example, a portion of the second semiconductor layer 20 is removed; and the first electrode 51 and the first insulating layer 58A are filled into the removed portion. The second semiconductor layer 20 is not provided between the first insulating layer 58A and the first semiconductor layer 10. A normally-off operation is obtained in the first reference example as well. However, in the first reference example, for example, the threshold voltage is determined by the work function of the metal used as the gate electrode. Therefore, in the first reference example, the threshold voltage is limited. Conversely, in the first element portion 71 according to the embodiment, the threshold voltage can be controlled by the doping concentration into the polycrystalline wide-gap material. Therefore, in the embodiment, the degrees of freedom of the adjustment of the threshold voltage are high.

On the other hand, there is a second reference example of a recessed n-MOSFET. In the second reference example, a portion of the fourth semiconductor layer 40 is removed; and the fourth electrode 54 and the second insulating layer 58B are filled into the removed portion. The fourth semiconductor layer 40 is not provided between the second insulating layer 58B and the third semiconductor layer 30. A normally-off operation is obtained in the second reference example as well. However, in the second reference example, for example, the threshold voltage is determined by the work function of the metal used as the gate electrode. Therefore, in the second reference example, the threshold voltage is limited. Conversely, in the second element portion 72 according to the embodiment, the threshold voltage can be controlled by the doping concentration into the polycrystalline wide-gap material. Therefore, in the embodiment, the degrees of freedom of the adjustment of the threshold voltage are high.

There is a third reference example in which a metal is used as the first electrode 51 in the configuration of the first element portion 71. In the reference example, the work function is about 5 eV. Therefore, the two-dimensional hole gas 2DHG is generated under the first electrode 51 in addition to under the second electrode 52 and the third electrode 53. Therefore, the third reference example is a semiconductor device having a normally-on operation. Conversely, in the first element portion 71 according to the embodiment, the normally-off operation is obtained. A safe semiconductor device can be provided. The ease of use can be improved.

There is a fourth reference example in which a metal is used as the fourth electrode 54 in the configuration of the second element portion 72. In the reference example, the work function is about 5 eV. Therefore, the two-dimensional electron gas 2DEG is generated under the fourth electrode 54 as well as under the fifth electrode 55 and the sixth electrode 56. Therefore, the fourth reference example is a semiconductor device having a normally-on operation. Conversely, in the second element portion 72 according to the embodiment, the normally-off operation is obtained. A safe semiconductor device can be provided. The ease of use can be improved.

An example of the band structures of the semiconductor devices will now be described.

Figure 2A:
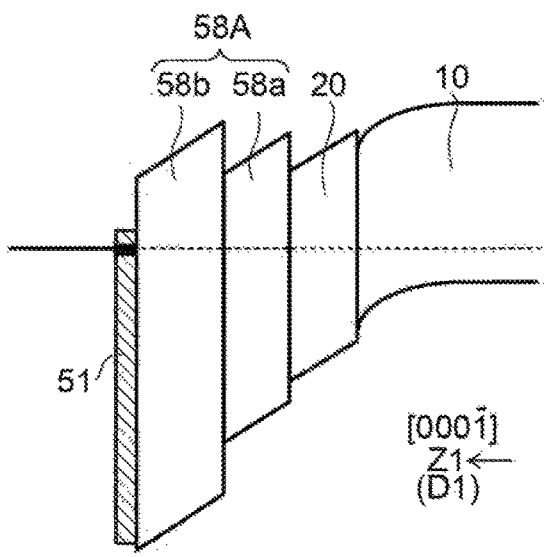
FIG. 2A to FIG. 2C are schematic views illustrating the band structures of the semiconductor devices.
Figure 2B:
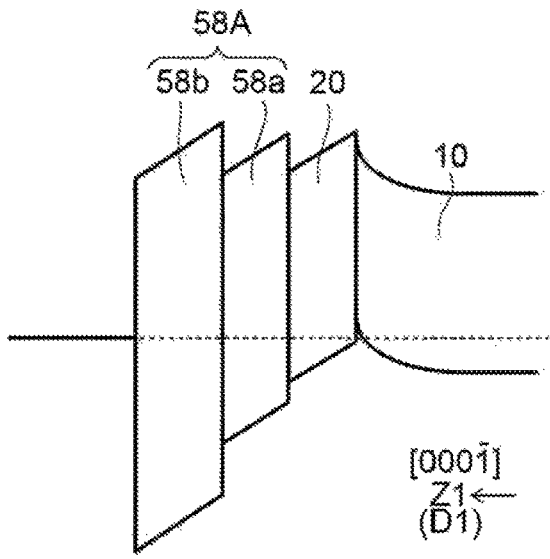
Figure 2C:
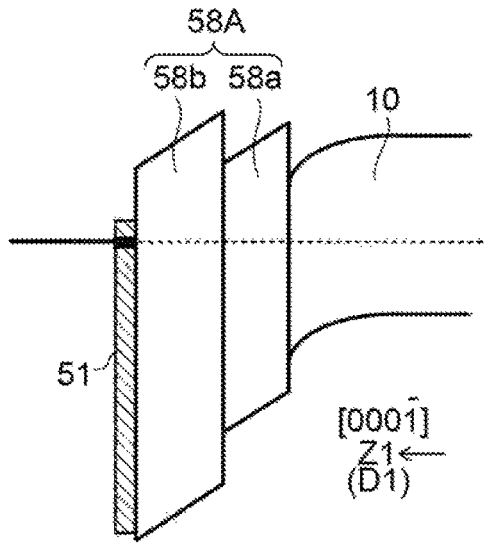

FIG. 2A to FIG. 2C are schematic views illustrating the band structures of the semiconductor devices. FIG. 2A corresponds to the first element portion 71 according to the first embodiment. FIG. 2A corresponds to an example of the band structure of the p-MOSFET having the normally-off operation. FIG. 2B is an example of the band structure of the p-MOSFET of the reference example. In the reference example, the gate electrode is a metal; and a normally-on operation is obtained. FIG. 2C is an example of the band structure of the recessed p-MOSFET of the reference example.

Figure 3A:
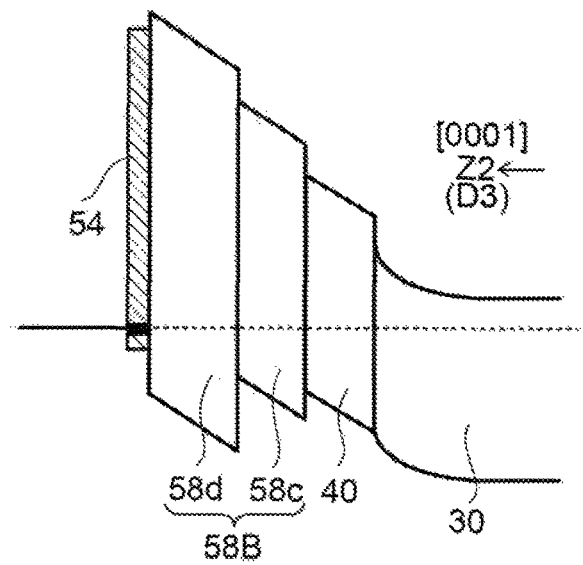
FIG. 3A to FIG. 3C are schematic views illustrating the band structures of the semiconductor devices.
Figure 3B:
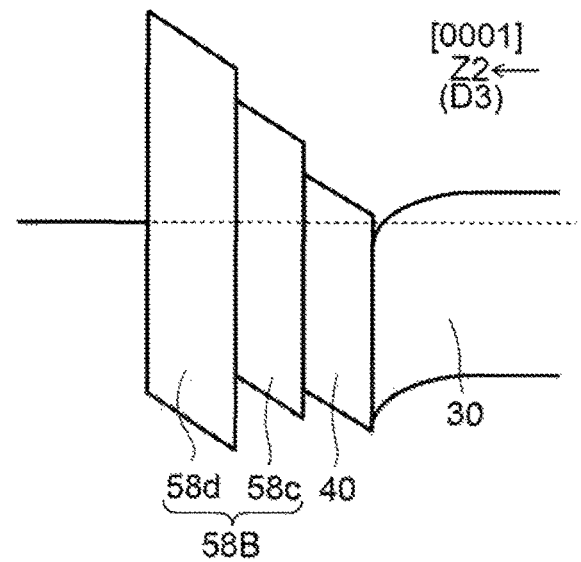
Figure 3C:
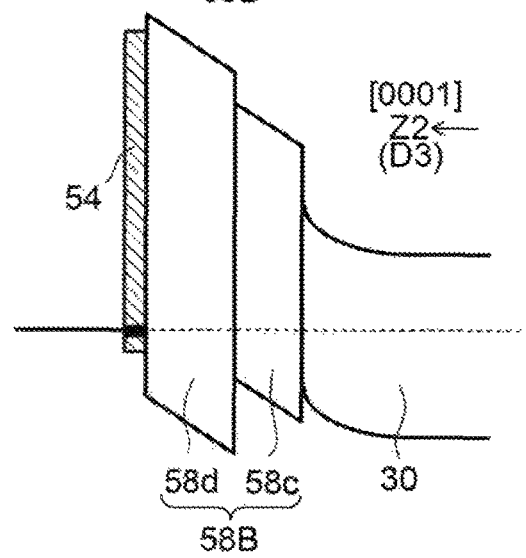

FIG. 3A to FIG. 3C are schematic views illustrating the band structures of the semiconductor devices. FIG. 3A corresponds to the second element portion 72 according to the first embodiment. FIG. 3A corresponds to an example of the band structure of the n-MOSFET having the normally-off operation. FIG. 3B is an example of the band structure of the n-MOSFET of the reference example. In the reference example, the gate electrode is a metal; and a normally-on operation is obtained. FIG. 3C is an example of the band structure of the recessed n-MOSFET of the reference example.

For example, the first element portion 71 and the second element portion 72 according to the embodiment have "HEMT (High Electron Mobility Transistor) structures." These element portions do not have recessed structures such as those recited above. For example, a high-speed operation is possible due to the "HEMT structure." In the embodiment, the manufacturing is easy because the structure is simple.

In the embodiment, the gate electrode includes at least one of polycrystalline aluminum nitride or polycrystalline boron nitride. Thereby, the normally-off operation is realized in the "HEMT structure."

In the embodiment, the impurity that is included in the material of such a gate electrode is corrected. Thereby, the work function of the gate electrode can be set appropriately. Thereby, the threshold voltage can be set appropriately. The resistance of the gate electrode can be low. For example, the semiconductor device according to the embodiment is applicable to an inverter, etc. The threshold voltage can be set easily to the desired state; and the ease of use can be improved.

In the embodiment, it is favorable for the first electrode 51 to include a polycrystal of AlN. For example, a band alignment that realizes a normally-off operation is obtained easily in the stacked structure of the first semiconductor layer 10, the second semiconductor layer 20, the first insulating layer 58A, and the first electrode 51. Good characteristics are obtained easily.

In the embodiment, it is favorable for the fourth electrode 54 to include a polycrystal of BN. For example, a band alignment that realizes a normally-off operation is obtained easily in the stacked structure of the third semiconductor layer 30, the fourth semiconductor layer 40, the second insulating layer 58B, and the fourth electrode 54. Good characteristics are obtained easily.

For example, the first element portion 71 may be formed on the upper surface of the substrate (e.g., the substrate 61s); and the second element portion 72 may be formed on the lower surface of the substrate (e.g., the substrate 61s). For example, the first element portion 71 (the p-MISFET) may be formed on the Ga-plane of the GaN substrate; and the second element portion 72 (the n-MISFET) may be formed on the N-plane of the GaN substrate.

At least one of the second electrode 52 or the third electrode 53 may include, for example, the same material as the first electrode 51. At least one of the second electrode 52 or the third electrode 53 may include, for example, a material that is different from the first electrode 51. At least one of the second electrode 52 or the third electrode 53 may include, for example, a metal (e.g., at least one selected from the group consisting of Al, Ti, Ni, Au, Cu, Mo, and Pt, etc.).

At least one of the fifth electrode 55 or the sixth electrode 56 may include, for example, the same material as the fourth electrode 54. At least one of the fifth electrode 55 or the sixth electrode 56 may include, for example, a material that is different from the fourth electrode 54. At least one of the fifth electrode 55 or the sixth electrode 56 may include, for example, a metal (e.g., at least one selected from the group consisting of Al, Ti, Ni, Au, Cu, Mo, and Pt, etc.).

Figure 4:
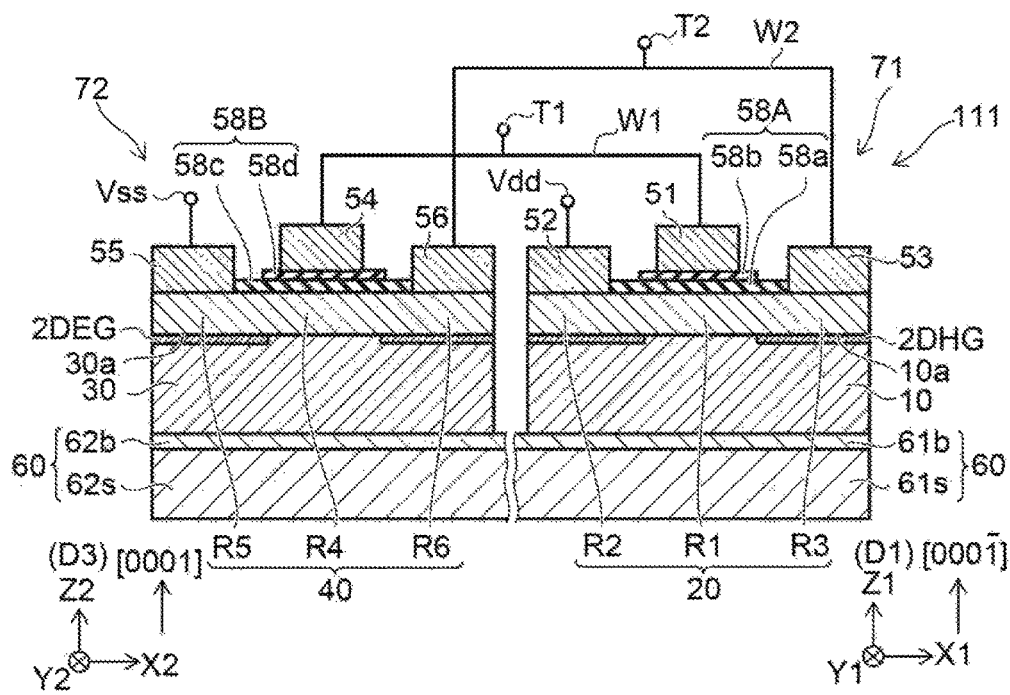
FIG. 4 is a schematic view illustrating another semiconductor device according to the first embodiment.

FIG. 4 is a schematic view illustrating another semiconductor device according to the first embodiment.

As shown in FIG. 4, the semiconductor device 111 according to the embodiment further includes a first interconnect W1 in addition to the first element portion 71 and the second element portion 72 recited above.

The first interconnect W1 electrically connects the first electrode 51 to the fourth electrode 54.

For example, the semiconductor device 111 functions as a NOT circuit. For example, the first interconnect W1 is electrically connected to a first terminal T1. For example, the second electrode 52 is set to a first voltage Vdd. For example, the fifth electrode 55 is set to a second voltage Vss. The first voltage Vdd is higher than the second voltage Vss. For example, the third electrode 53 and the sixth electrode 56 are electrically connected to a second terminal T2 by a second interconnect W2.

For example, the inverse of the value input to the first terminal T1 is output to the second terminal T2.

The description recited above is an example of the utilization state of the semiconductor device according to the embodiment. The utilization state of the semiconductor device according to the embodiment is arbitrary.

Second Embodiment

Figure 5:
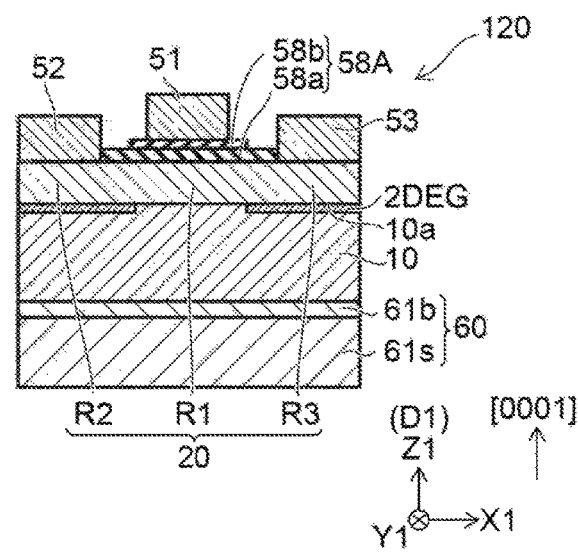
FIG. 5 is a schematic view illustrating another semiconductor device according to a second embodiment.

FIG. 5 is a schematic view illustrating another semiconductor device according to a second embodiment.

As shown in FIG. 5, the semiconductor device 120 according to the embodiment includes the first semiconductor layer 10, the second semiconductor layer 20, the first to third electrodes 51 to 53, and the first insulating layer 58A.

In the semiconductor device 120, the first electrode 51 is positioned in the [0001] direction of the first semiconductor layer 10. The first electrode 51 includes at least one first element selected from the group consisting of Mg, Be, Zn, and C. Otherwise, the semiconductor device 120 is similar to the first element portion 71 described in reference to FIG. 1.

In the semiconductor device 120, the first semiconductor layer 10 includes $Al_{x1}Ga_{1-x1}N$ (0≤x1<1). The composition ratio x1 of Al of the first semiconductor layer 10 is, for example, 0.01 or less. The composition ratio x1 may be substantially 0. The first semiconductor layer 10 may be, for example, a GaN layer.

The first electrode 51 is separated from the first semiconductor layer 10 in the first direction D1. The first electrode 51 is positioned in the [0001] direction of the first semiconductor layer 10. For example, the surface 10a of the first semiconductor layer 10 is, for example, the N-plane of a GaN layer. The [0001] direction may be tilted with respect to the first direction D1. The first electrode 51 includes a polycrystal of a nitride of one of Al or B.

The second semiconductor layer 20 includes the first to third regions R1 to R3. In the second direction, the first region R1 is positioned between the second region R2 and the third region R3. The second direction crosses the first direction D1. The first region R1 is provided between the first semiconductor layer 10 and the first electrode 51.

The second semiconductor layer includes $Al_{x2}Ga_{1-x2}N$ (x1<x2<1). The composition ratio of Al of the second semiconductor layer 20 is, for example, not less than 0.1 and not more than 0.4. The second semiconductor layer 20 is, for example, an AlGaN layer. For example, the second semiconductor layer 20 physically contacts the first semiconductor layer 10.

The first insulating layer 58A is provided between the first electrode 51 and the first region R1 of the second semiconductor layer 20.

The second electrode 52 is electrically connected to the second region R2. The third electrode 53 is electrically connected to the third region R3. For example, the second electrode 52 has an ohmic contact with the second region R2. For example, the third electrode 53 has an ohmic contact with the third region R3.

For example, the first insulating layer 58A includes at least one selected from the group consisting of silicon oxide (e.g., $SiO_2$), magnesium oxide (MgO), aluminum oxide (e.g., $Al_2O_3$), silicon nitride (e.g., SiN), aluminum nitride (AlN), and boron nitride (BN).

In the example, the first insulating layer 58A includes the first insulating film 58a and the second insulating film 58b. The second insulating film 58b is provided between the first insulating film 58a and the first electrode 51. For example, the first insulating film 58a includes a nitride. The second insulating film 58b includes an oxide. For example, the first insulating film 58a Includes at least one selected from the group consisting of silicon nitride, aluminum nitride, and boron nitride. The second insulating film 58b includes at least one selected from the group consisting of silicon oxide, aluminum oxide, zirconium oxide, and magnesium oxide.

The first electrode 51 includes at least one element selected from the group consisting of Mg, Be, Zn, and C. The element is, for example, an impurity. The concentration of the element of the first electrode 51 is, for example, not less than $10^{15}$ $cm^{-3}$ and not more than $10^{22}$ $cm^{-3}$. The element functions as a p-type impurity of the first electrode 51. For example, the threshold of the first element portion 71 can be set to be high.

For example, the semiconductor device 120 has a normally-off operation. The semiconductor device 120 is, for example, an n-MISFET (n-type Metal Insulator Semiconductor Field Effect Transistor) having a normally-off operation.

In the semiconductor device 120 as well, a semiconductor device can be provided in which the ease of use can be improved.

According to the embodiment, a semiconductor device can be provided in which the ease of use can be improved.

In the specification, "nitride semiconductor" includes all compositions of semiconductors of the chemical formula $B_xIn_yAl_zGa_{1-x-y-z}N$ (0≤x≤1, 0≤y≤1, 0≤z≤1, and x+y+z≤1) for which the composition ratios x, y, and z are changed within the ranges respectively. "Nitride semiconductor" as described In the specification further includes group V elements other than N (nitrogen) in the chemical formula recited above, various elements added to control various properties such as the conductivity type and the like, and various elements included unintentionally.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the semiconductor device such as the semiconductor layer, the electrode, the base body, the substrate, the buffer layer, the interconnect, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied In a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a first element portion including
a first semiconductor layer including $Al_{x1}Ga_{1-x1}N$ (0≤x1<1), a first electrode separated from the first semiconductor layer in a first direction, the first electrode being positioned in the [000-1] direction of the first semiconductor layer, and the first electrode including at least one selected from the group consisting of a polycrystal of a nitride of Al and a polycrystal of a nitride of B, a second semiconductor layer including $Al_{x2}Ga_{1-x2}N$ (x1<x2<1), the second semiconductor layer including first to third regions, the first region being positioned between the second region and the third region in a second direction crossing the first direction, the first region being provided between the first semiconductor layer and the first electrode, a first insulating layer provided between the first region and the first electrode, a second electrode electrically connected to the second region, and a third electrode electrically connected to the third region; and a second element portion including a third semiconductor layer including $Al_{x3}Ga_{1-x3}N$ (0≤x3<1), a fourth electrode separated from the third semiconductor layer in a third direction, the fourth electrode being positioned in the [0001] direction of the third semiconductor layer, and the fourth electrode including at least one selected from the group consisting of a polycrystal of a nitride of Al and a polycrystal of a nitride of B, a fourth semiconductor layer including $Al_{x4}Ga_{1-x4}N$ (x3<x4<1), the fourth semiconductor layer including fourth to sixth regions, the fourth region being positioned between the fifth region and the sixth region in a fourth direction crossing the third direction, the fourth region being provided between the third semiconductor layer and the fourth electrode, a second insulating layer provided between the fourth region and the fourth electrode, a fifth electrode electrically connected to the fifth region, and a sixth electrode electrically connected to the sixth region.

2. The device according to claim 1, wherein the first electrode includes at least one first element selected from the group consisting of Si, Ge, C, and O.

3. The device according to claim 2, wherein a concentration of the first element of the first electrode is not less than $10^{15}$ cm$^{-3}$ and not more than $10^{22}$ cm$^{-3}$.

4. The device according to claim 1, wherein the first insulating layer includes at least one selected from the group consisting of silicon oxide, magnesium oxide, aluminum oxide, silicon nitride, aluminum nitride, and boron nitride.

5. The device according to claim 1, wherein the first insulating layer includes
a first insulating film including a nitride, and
a second insulating film provided between the first insulating film and the first electrode, the second insulating film including an oxide.

6. The device according to claim 3, wherein
the first insulating film includes at least one selected from the group consisting of silicon nitride, aluminum nitride, and boron nitride, and
the second insulating film includes at least one selected from the group consisting of silicon oxide, aluminum oxide, zirconium oxide, and magnesium oxide.

7. The device according to claim 1, wherein
x1 is 0.01 or less, and
x2 is not less than 0.1 and not more than 0.4.

8. The device according to claim 1, wherein the second semiconductor layer contacts the first semiconductor layer.

9. The device according to claim 1, wherein the first element portion has a normally-off operation.

10. The device according to claim 1, wherein the fourth electrode includes at least one second element selected from the group consisting of Mg, Be, Zn, and C.

11. The device according to claim 10, wherein a concentration of the second element of the fourth electrode is not less than $10^{15}$ cm$^{-3}$ and not more than $10^{22}$ cm$^{-3}$.

12. The device according to claim 1, wherein the second insulating layer includes at least one selected from the group consisting of silicon oxide, magnesium oxide, aluminum oxide, silicon nitride, aluminum nitride, and boron nitride.

13. The device according to claim 1, wherein the second insulating layer includes
a third insulating film including a nitride, and
a fourth insulating film provided between the third insulating film and the fourth electrode, the fourth insulating film including an oxide.

14. The device according to claim 13, wherein
the third insulating film includes at least one selected from the group consisting of silicon nitride, aluminum nitride, and boron nitride, and
the fourth insulating film includes at least one selected from the group consisting of silicon oxide, aluminum oxide, zirconium oxide, and magnesium oxide.

15. The device according to claim 1, wherein
x3 is 0.01 or less, and
x4 is not less than 0.1 and not more than 0.4.

16. The device according to claim 1, wherein the fourth semiconductor layer contacts the third semiconductor layer.

17. The device according to claim 1, wherein the second element portion has a normally-off operation.

18. The device according to claim 1, further comprising a first interconnect electrically connecting the first electrode to the fourth electrode.

* * * * *